United States Patent
Hiura

[19]

[11] Patent Number: 6,165,883
[45] Date of Patent: Dec. 26, 2000

[54] METHOD FOR FORMING MULTILAYER SIDEWALLS ON A POLYMETAL STACK GATE ELECTRODE

[75] Inventor: Yohei Hiura, Yokohama, Japan

[73] Assignee: Kabushiki Kaisha Toshiba, Kawasaki, Japan

[21] Appl. No.: 09/442,456

[22] Filed: Nov. 18, 1999

[30] Foreign Application Priority Data

Nov. 20, 1998 [JP] Japan ................... 10-331136

[51] Int. Cl.⁷ ............................. H01L 21/3205
[52] U.S. Cl. ................. 438/592; 438/265; 438/696; 257/900
[58] Field of Search .................. 438/595, 184, 438/230, 231, 303, 265, 696; 257/900

[56] References Cited

U.S. PATENT DOCUMENTS

| | | | |
|---|---|---|---|
| 5,545,578 | 8/1996 | Park et al. | 437/44 |
| 5,719,410 | 2/1998 | Suehiro et al. | 257/77 |
| 5,960,270 | 9/1999 | Misra et al. | 438/197 |
| 5,977,600 | 11/1999 | Wristers et al. | 257/408 |
| 5,998,290 | 12/1999 | Wu et al. | 438/595 |

FOREIGN PATENT DOCUMENTS 11-87695  3/1999  Japan .

OTHER PUBLICATIONS

IEDM Technical Digest, "Integration Technorology of Polymetal (W/WSiN/Poly–Si) Dual Gate CMOS for 1Gbit DRAMs and Beyond", p. 389, Yohei Hiura et al., 1998.

*Primary Examiner*—Charles Bowers
*Assistant Examiner*—Erik Kielin
*Attorney, Agent, or Firm*—Banner & Witcoff, Ltd.

[57] ABSTRACT

A gate electrode having a polymetal structure which is composed of polysilicon, tungsten nitride and tungsten is formed on a silicon substrate by RIE where a silicon nitride film is used as a mask. Thereafter, a silicon oxide film of about 3 nm is formed by selective oxidation, and a silicon nitride film of about 10 nm is formed by CVD. Moreover, the silicon nitride film is etched by using the silicon substrate as an etching stopper. Thereafter, a silicon oxide film of about 6 nm is formed again by thermal oxidation, and a silicon nitride film of about 20 nm is formed by CVD. Then, the silicon nitride film is etched by using the silicon oxide film as an etching stopper.

17 Claims, 3 Drawing Sheets

METHOD FOR FORMING MULTILAYER SIDEWALLS ON A POLYMETAL STACK GATE ELECTRODE

BACKGROUND OF THE INVENTION

The present invention relates to a manufacturing method of a semiconductor device, more specifically, the present invention is applied to a MOSFET having a gate electrode of a polymetal structure wherein the refractory metal and polysilicon are stuck.

Conventionally, a MOSFET having a gate electrode of a polymetal structure (for example, W/WxNySiz/Si) wherein the refractory metal and polysilicon are stuck is manufactured by the following manufacturing process.

At first, a well-known technique is used so that a N type or P type well area is formed in a silicon substrate, and an element separation insulating film, which is composed of LOCOS or STI structure, is formed on the silicon substrate.

As shown in FIG. 1, a silicon oxide film (gate insulating film) 101 having a thicknes of about 4 nm is formed on the silicon substrate 100 as an element area surrounded by the element separation insulating film by thermal oxidation. Moreover, a polysilicon film 102 having a thickness of about 100 nm is formed on the silicon oxide film 101 by the CVD method. Thereafter, a donor such as phosphorus (P) is introduced into the polysilicon film 102 in the area where N-channel type MOSFET is formed, and an acceptor such as boron (B) is introduced into the polysilicon film 102 in the area where P-channel type MOSFET is formed by using the ion implantation method.

Next, as shown in FIG. 2, tungsten nitride film 103 having a thickness of about 5 nm, a tungsten film 104 having a thickness of about 40 nm and a silicon nitride film 105 having a thickness of about 180 nm are deposited on the polysilicon film 102 by using the CVD method or the sputter method so that a laminated film which is composed of silicon nitride film/tungsten film/tungsten nitride film/polysilicon film is formed.

Next, as shown in FIG. 3, a resist pattern (not shown) is formed on the silicon nitride film 105 by photo-lithography, and the silicon nitride film 105 is etched according to RIE by using the resist pattern as a mask. Thereafter, the resist pattern is removed.

Next, as shown in FIG. 4, the tungsten film 104, the tungsten nitride film 103 and the polysilicon film 102 are etched according to RIE by using the silicon nitride film 105 as a mask so that a gate electrode having a polymetal structure is formed.

Thereafter, a partial pressure of hydrogen and vapor ($H_2O$) is controlled so that only the silicon is selectively oxidized at a temperature of about 800° C. without oxidizing the tungsten. As a result, a silicon oxide film 106 of about 3 nm (generally called a "post-oxide film", as it is an oxide film which is formed by the oxidizing process executed after processing the gate electrode) is formed selectively on exposed side surfaces of the silicon substrate 100 and the polysilicon film 102.

Here, the selective oxidation is used for forming the silicon oxide film 106 because if the tungsten film 104 is oxidized, abrupt volume expansion (abnormal oxidation) occurs, and thus the tungsten film 104 is broken.

Next, as shown in FIG. 5, impurity is implanted into the silicon substrate 100 according to the ion implantation method by using the gate electrode as a mask with the impurity being self-aligned. Here, an N type impurity such as phosphorus (P) is implanted as the impurity into the area where the N-channel type MOSFET is formed, and P type impurity such as boron (B) is implanted as the impurity into the area where the P-channel type MOSFET is formed. As a result, a shallow impurity area (hereinafter, referred to as extension area 108) is formed in the silicon substrate 100.

Thereafter, a silicon nitride film 107 having a thickness of about 20 nm which covers completely the gate electrode is deposited on the whole surface of the silicon substrate 100 by using the CVD method.

Next, as shown in FIG. 6, the silicon nitride film 107 is etched by RIE, and it is allowed to remain only on the side surface of the gate electrode, more concretely, on the side surfaces of the silicon nitride film 105, tungsten film 104, tungsten nitride film 103 and the polysilicon film 102. The silicon nitride film 107 on the side surface of the gate electrode is called a side wall.

In RIE, the silicon substrate 100 is used as an etching stopper. This is because since the silicon oxide film 106 is thin, and it cannot be used as the etching stopper (this point will be detailed below).

Thereafter, impurity is implanted into the silicon substrate 100 according to the ion implantation method by using the gate electrode and the side wall as a mask with the impurity being self-aligned. N type impurity such as phosphorus (P) and arsenic (As) is implanted as the impurity into the area where the N-channel type MOSFET is formed, and P type impurity such as boron (B) is implanted as the impurity into the area where the P-channel type MOSFET is formed. As a result, a source/drain area 109 which is denser and deeper than the extension area 108 is formed in the silicon substrate 100.

According to the above sequential process, the MOSFET having the gate electrode of the polymetal structure is finished.

(1) A disadvantage of the above-mentioned manufacturing process is that the silicon substrate 100 is used as the etching stopper in RIE of the silicon nitride film 107 for forming the side wall. In this RIE, the condition of the silicon substrate 100 is such that its etching is more difficult than the etching of the silicon nitride film 107, namely, such that the silicon substrate has an etching selective ratio with respect to the silicon nitride film 107. However, as shown in FIG. 7, the silicon substrate 100 is etched at the time of over-etching, and thus the silicon substrate 100 is occasionally damaged. Such damage causes an increase in junction leak current in the source/drain area 109.

(2) In addition, at the time of forming the side wall, the silicon substrate 100 is not used as the etching stopper, but the silicon oxide film 106 can be used as the etching stopper. However, as mentioned above, a thickness of the silicon oxide film 106 is set to several nm, namely, very thin. Moreover, in RIE of the silicon nitride film 107, the etching selective ratio of the silicon oxide film 106 and the silicon nitride film 107 cannot be large enough. Therefore, at the time of RIE, a hole is formed in the silicon oxide film 106, and further the silicon oxide film 106 is removed completely, and thus the silicon substrate 100 is exposed. As a result, the silicon substrate 100 does not have the etching selective ratio at all with respect to the silicon nitride film 107, and thus as shown in FIG. 8, the silicon substrate 100 is etched deep (OVER ETCH).

(3) In addition, the silicon oxide film 106 having a sufficient thickness can be formed by the selective oxidization after the process of the gate electrode. For example, the temperature of the selective oxidation is set to about 900° C., and the thickness of the silicon oxide film 106 which is formed on the side surfaces of the silicon substrate 100 and the polysilicon film 102 can be set to about 60 nm. In this case, at the time of forming the side wall, if the silicon oxide film 106 is used as the etching stopper of RIE, the silicon oxide film 106 is not removed completely, and thus the etching of the silicon substrate 100 can be prevented.

However, in order to form the sufficiently thick silicon oxide film 106, the oxidation should be executed in an atmosphere of hydrogen which is higher than usual. In this case, as shown in FIG. 9, in the P-channel type MOSFET, the boron in the polysilicon film (gate electrode) 102 penetrates the silicon oxide film (gate insulating film) 101 so as to be diffused into the silicon substrate (channel) 100. Moreover, gate bird's beak is formed at the edge portion of the polysilicon film 102, and an effective gate insulating film is made to be thick. When such a situation arises, element properties such as the threshold value of MOSFET is scattered.

BRIEF SUMMARY OF THE INVENTION

The present invention has been achieved with such points in view. It is therefore an object of the present invention to provide a manufacturing method which does not cause great damage to a silicon substrate and eliminates scattering of element properties due to penetration of boron and forming of gate bird's beak when forming a side wall of a MOSFET with a gate electrode of a polymetal structure.

In order to achieve the above object, a manufacturing method of semiconductor device according to the present invention includes the steps of: forming a gate electrode, whose lower layer is composed of polysilicon and upper layer is composed of refractory metal, on a silicon substrate; forming a first silicon nitride film on the silicon substrate so as to cover the gate electrode; etching the first silicon nitride film so as to let the first silicon nitride film remain on a side surface of the gate electrode; forming a first silicon oxide film on the silicon substrate using thermal oxidation; forming a second silicon nitride film on the silicon substrate so as to cover the gate electrode; and etching the second silicon nitride film so as to let the second silicon nitride film remain on the side surface of the gate electrode.

The refractory metal is tungsten, and tungsten nitride is positioned between the polysilicon the refractory metal. The polysilicon contains boron.

In addition, a method according to the present invention includes the step of, before forming the first silicon nitride film, forming a second silicon oxide film on surfaces of the silicon substrate and the polysilicon using selective oxidation.

The selective oxidation is executed in an atmosphere of hydrogen and vapor ($H_2O$). Moreover, the thermal oxidation is selective oxidation executed in an atmosphere of hydrogen and vapor.

The first silicon oxide film is formed so as to be thicker than the second silicon oxide film. Further, the first silicon nitride film is etched under a condition that the silicon substrate is used as an etching stopper, and the second silicon nitride film is etched under a condition that the first silicon oxide film is used as an etching stopper.

A method according to the present invention further includes the steps of: forming a shallow impurity area using ion implantation where the gate electrode is used as a mask; and forming a deep impurity area to be a source/drain using ion implantation where the gate electrode and the first and second silicon nitride films are used as a mask.

A manufacturing method of semiconductor device according to the present invention includes the steps of: forming a gate electrode on a silicon substrate; forming a non-oxidizable protecting film on the silicon substrate so as to cover the gate electrode; etching the non-oxidizable protecting film so as to let the non-oxidizable protecting film remain on a side surface of the gate electrode; forming a first silicon oxide film on the silicon substrate using thermal oxidation; forming a spacer film on the silicon substrate so as to cover the gate electrode; and etching the spacer film so as to let the spacer film remain on the side surface of the gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will be detailed below a method of manufacturing a semiconductor device of the present invention with reference to the drawings.

FIGS. 10 through 18 show steps of the method of manufacturing the semiconductor device of the present invention.

The present embodiment relates to a method of manufacturing MOSFET having a gate electrode of a polymetal structure wherein refractory metal and polysilicon are stuck (W/WxNySiz/Si).

At first, the well-known technique is used so that a N or P type well area is formed in a silicon substrate, and an element separation insulating film which is composed of LOCOS or STI structure is formed on the silicon substrate.

Figure 10:
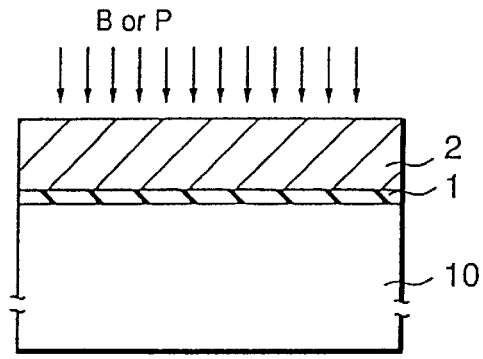
FIG. 10 is a sectional view showing one step of a manufacturing method of the present invention.

Next, as shown in FIG. 10, a silicon oxide film (gate insulating film) 1 of about 4 nm is formed by thermal oxidation on a silicon substrate 10 as an element area surrounded by the element separation insulating film. Moreover, a polysilicon film 2 is formed on the silicon oxide film 1 by the CVD method so as to have a thickness of about 100 nm or less than 100 nm (50 to 70 nm). Thereafter, donor such as phosphorus (P) is introduced into the polysilicon film 2 in an area where the N-channel type MOSFET is formed, and acceptor such as boron (B) is introduced into the polysilicon film 2 in an area where the P-channel type MOSFET is formed by using the ion implantation method.

Figure 11:
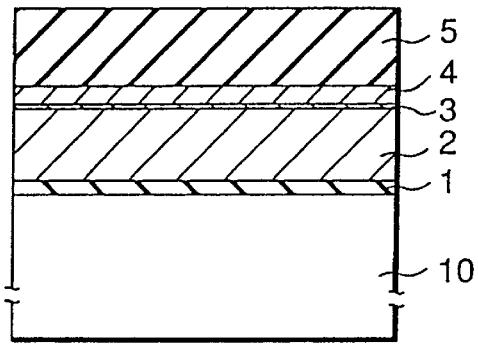
FIG. 11 is a sectional view showing one step of the manufacturing method of the present invention.

Next, as shown in FIG. 11, a tungsten nitride film 3 having a thickness of about 5 nm and a tungsten film 4 having a thickness of about 40 nm are formed on the polysilicon film 2 by using the sputtering method, and a silicon nitride film 5 having a thickness of about 180 nm is formed on the tungsten film 4 by using the CVD method so that a laminated film which is composed of silicon nitride film/tungsten film/tungsten nitride film/polysilicon film is formed.

Figure 12:
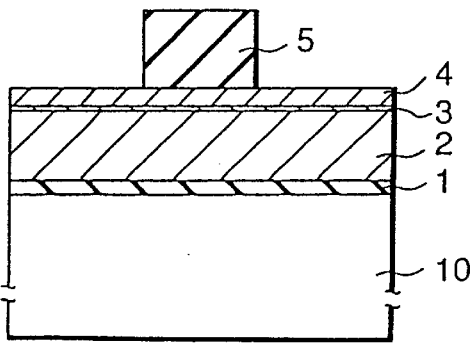
FIG. 12 is a sectional view showing one step of the manufacturing method of the present invention.

Next, as shown in FIG. 12, a resist pattern (not shown) is formed on the silicon nitride film 5 by photolithography, and the silicon nitride film 5 is etched according to RIE by using the resist pattern as a mask. Thereafter, the resist pattern is removed.

Figure 13:
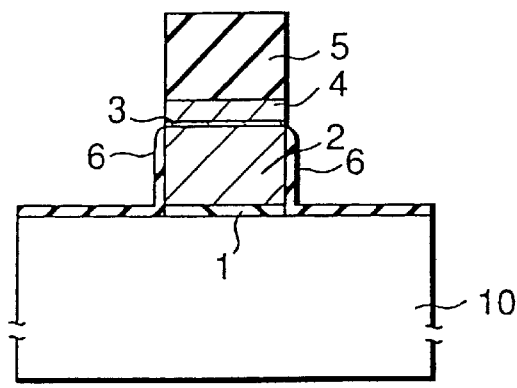
FIG. 13 is a sectional view showing one step of the manufacturing method of the present invention.

Next, as shown in FIG. 13, the tungsten film 4, tungsten nitride film 3 and the polysilicon film 2 are etched according to RIE by using the silicon nitride film 5 as a mask so that a gate electrode having a polymetal structure is formed.

Thereafter, a partial pressure of hydrogen and vapor (H$_2$O) is controlled so that only the silicon is selectively oxidized at a temperature of about 800° C. without oxidizing the tungsten. A silicon oxide film 6 (called "post-oxide film", as it is an oxide film which is formed by the oxidizing process executed after processing of the gate electrode) of about 3 nm is formed selectively on exposed side surfaces of the silicon substrate 1 and polysilicon film 2.

An object of the selective oxidation is to recover damage of the silicon substrate 1 due to RIE used at the time of processing the gate electrode and to round an edge of the polysilicon film 2 as the need arises and to eliminate electrostatic focusing at the edge portion and to secure high reliability of the gate insulating film. Moreover, when the temperature of the selective oxidation is set to about 800° C. and the thickness of the silicon oxide film 6 is set to about 3 nm, penetration of the boron and forming of gate bird's beak in the P-channel type MOSFET can be prevented.

In addition, when the silicon oxide film 6 is formed by utilizing the selective oxidation, it can be formed without abnormally oxidizing the tungsten film 4.

Figure 14:
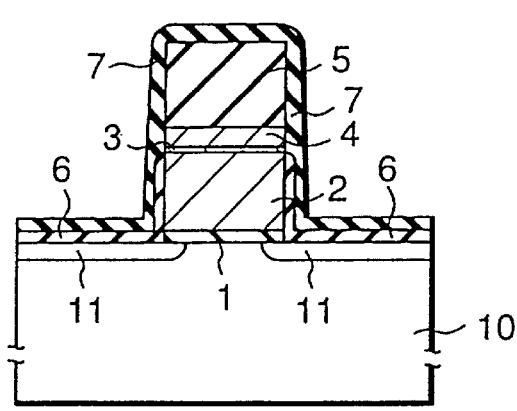
FIG. 14 is a sectional view showing one step of the manufacturing method of the present invention.

Next, as shown in FIG. 14, impurity is implanted into the silicon substrate 10 according to the ion implantation method by using the gate electrode as a mask with the impurity being self-aligned. Here, N type impurity such as phosphorus (P) is implanted as the impurity into the area where the N-channel type MOSFET is formed, and P type impurity such as boron (B) is implanted as the impurity into the area where the P-channel type MOSFET is formed. As a result, a shallow impurity area, namely, an extension area 11 is formed in the silicon substrate 10.

Thereafter, a silicon nitride film 7 having a thickness of not more than 10 nm (excluding 0), i.e., about 10 nm, for example, is deposited by the CVD method onto the silicon substrate 10 so as to cover the gate electrode completely.

Figure 1:
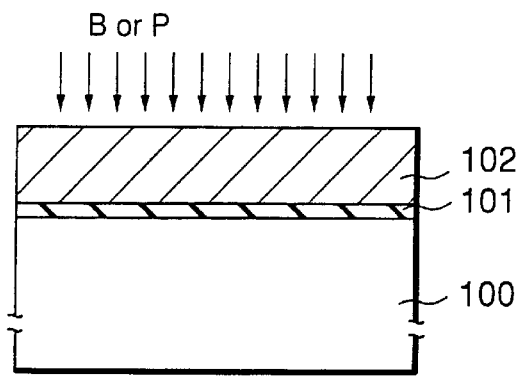
FIG. 1 is a sectional view showing one step of a conventional manufacturing method.
Figure 4:
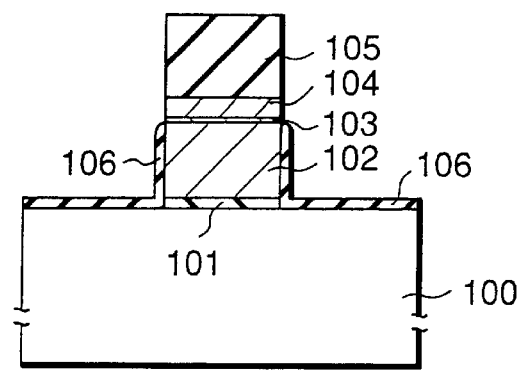
FIG. 4 is a sectional view showing one step of the conventional manufacturing method.
Figure 2:
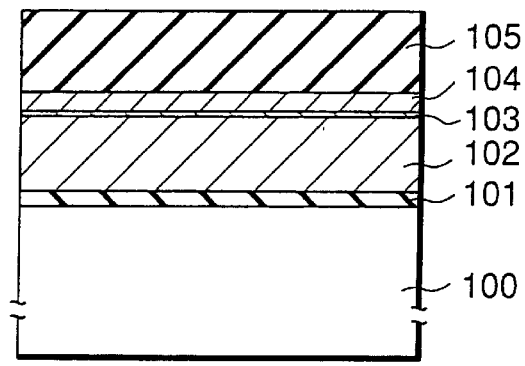
FIG. 2 is a sectional view showing one step of the conventional manufacturing method.
Figure 5:
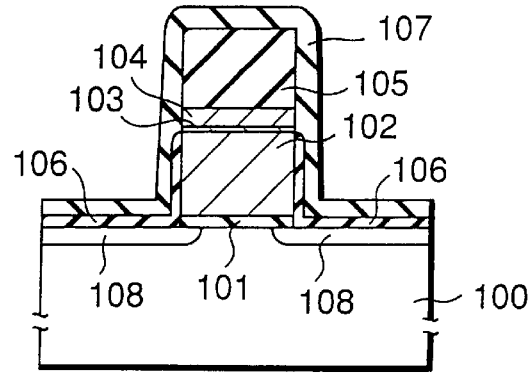
FIG. 5 is a sectional view showing one step of the conventional manufacturing method.
Figure 3:
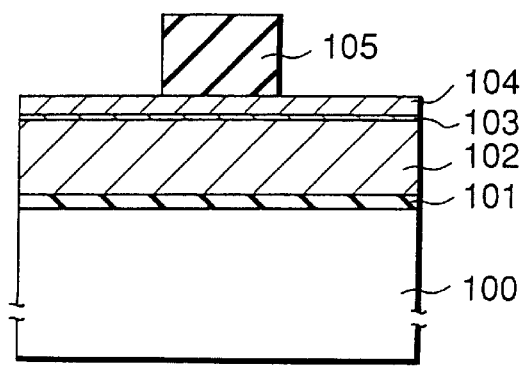
FIG. 3 is a sectional view showing one step of the conventional manufacturing method.
Figure 6:
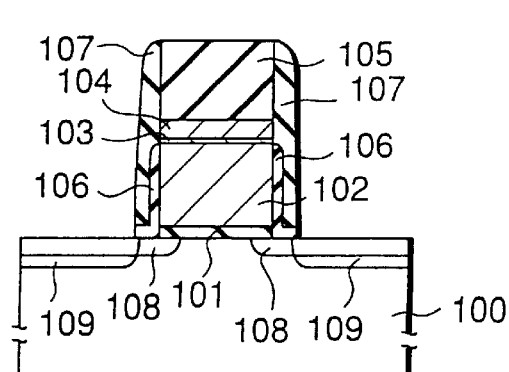
FIG. 6 is a sectional view showing one step of the conventional manufacturing method.
Figure 7:
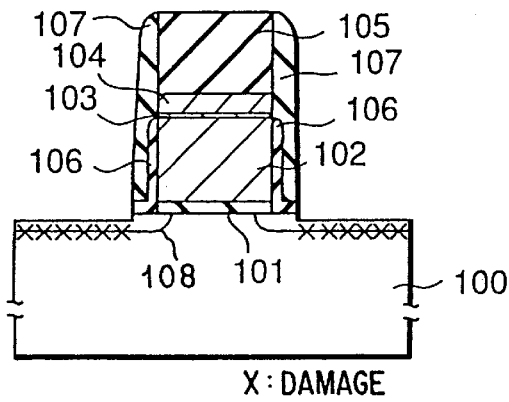
FIG. 7 is a sectional view showing one problem of a conventional manufacturing method.

Here, the thickness of the silicon nitride film 7 has been conventionally determined after considering that the film 7 becomes a spacer at the time of forming a source/drain area, but in the present embodiment, the thickness is determined after mainly considering that the film 7 can protect the tungsten film 4 from being oxidized. More concretely, the thickness is set to a value which is about the half of the conventional thickness (see FIG. 5).

Figure 15:
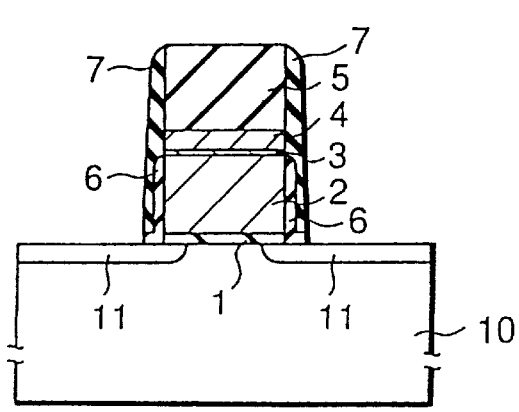
FIG. 15 is a sectional view showing one step of the manufacturing method of the present invention.

Next, as shown in FIG. 15, the silicon nitride film 7 is etched by RIE so as to remain only on a side surface of the gate electrode, more concretely, on side surfaces of the silicon nitride film 5, the tungsten film 4, the tungsten nitride film 3 and the polysilicon film 2. As a result, a first side wall composed of the silicon nitride film 7 is formed on the side surface of the gate electrode.

Figure 8:
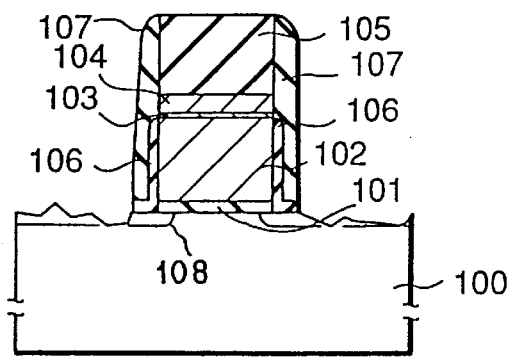
FIG. 8 is a sectional view showing one problem of the conventional manufacturing method.

The first side wall is formed by RIE under the condition that the silicon substrate 10 is used as an etching stopper. This is because the thickness of the silicon oxide film 6 is thin, i.e., set to about 3 nm. Therefore, digging in the substrate, which is caused when the silicon oxide film 6 is used as the etching stopper (see FIG. 8), can be prevented.

In addition, in the present embodiment, since the thickness of the silicon nitride film 7 is set to a value which is about half (about 10 nm) of the conventional thickness, when the first side wall is formed by RIE, over etching time can be shorter than the conventional example. Therefore, even in the case where the silicon substrate 10 is used as the etching stopper, damage of the substrate can be suppressed to a level that the damage can be neglected in the element property.

In the present invention, under the condition that the "post-oxide film" is used as the etching stopper, the first side wall may be formed. In this case, the damage of the silicon substrate can be suppressed completely.

Figure 16:
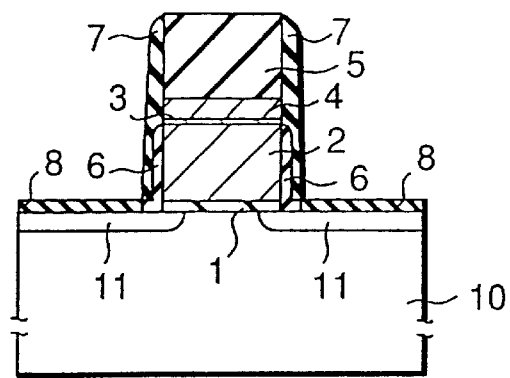
FIG. 16 is a sectional view showing one step of the manufacturing method of the present invention.

Next, as shown in FIG. 16, thermal oxidation such as RTO (rapid thermal oxidation) is executed at a temperature of about 1050° C. so that a silicon oxide film 8 having a thickness of about 6 nm is formed on the silicon substrate 10 (extension area 11). The silicon oxide film 8 is formed so as to be at least thicker than that of the silicon oxide film 6. This is because the silicon oxide film 8 is used as an etching stopper when a second side wall, mentioned later, is formed by RIE.

Figure 9:
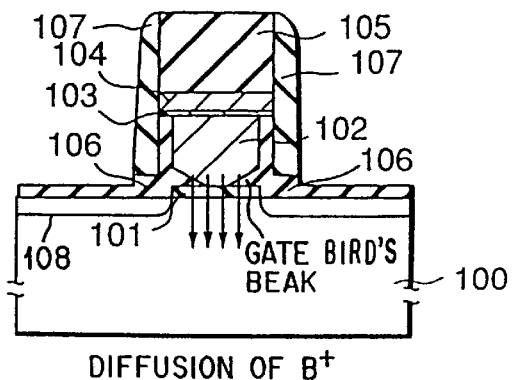
FIG. 9 is a sectional view showing one problem of the conventional manufacturing method.

As mentioned above, the silicon oxide film 8 can be formed by an oxidizing method (RTO and the like) other than the selective oxidation. This is because the tungsten film 4 is coated with the silicon nitride films 5 and 7 and thus it is not oxidized. As a result, a phenomenon that the boron penetrates from the polysilicon film 2 to the silicon substrate 10 due to an atmosphere of hydrogen at the time of the selective oxidation (see FIG. 9) can be avoided, and at the same time the forming of gate bird's beak can be prevented.

Figure 17:
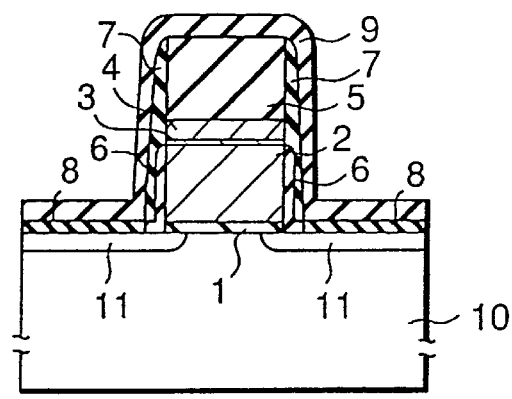
FIG. 17 is a sectional view showing one step of the manufacturing method of the present invention.

Next, as shown in FIG. 17, a silicon nitride film 9 having a thickness of about 20 nm which completely covers the gate electrode is deposited on the whole surface of the silicon substrate 10 by using the CVD method. The thickness of the silicon nitride film 9 is determined after considering that the film 9 becomes a spacer when the source/drain area is formed, more concretely, considering a length of the source/ drain area for thermal diffusion.

Figure 18:
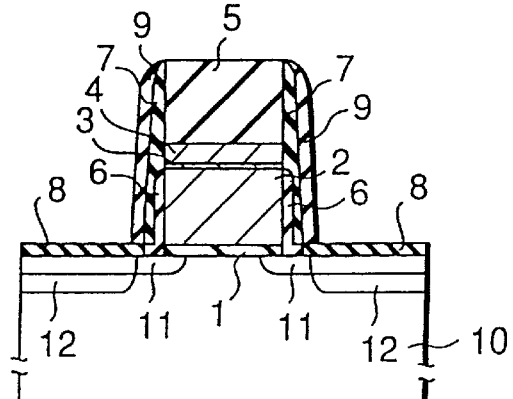
FIG. 18 is a sectional view showing one step of the manufacturing method of the present invention.

Next, as shown in FIG. 18, the silicon nitride film 9 is etched by RIE so as to remain only on the side surface of the gate electrode, more concretely, the side surfaces of the silicon nitride film 5, the tungsten film 4, the tungsten nitride film 3 and the polysilicon film 2. As a result, a second side wall composed of the silicon nitride film 9 is formed on the side surface of the gate electrode.

When the second side wall is formed by RIE, the silicon oxide film 8 is used as an etching stopper. This is because the thickness of the silicon oxide film 8 is set so as to be sufficiently thick, i.e., about 6 nm. Therefore, sufficient over etching can be executed at the time of RIE, and the silicon oxide film 8 is not completely etched, and the silicon substrate 10 is not damaged.

Thereafter, impurity is implanted into the silicon substrate 10 according to the ion implantation method by using the gate electrode, the first side wall and the second side wall as a mask with the impurity being self-aligned. Here, N type impurity such as phosphorus (P) and arsenic (As) is implanted as the impurity into the area where the N-channel type MOSFET is formed, and P type impurity such as boron (B) is implanted as the impurity into the area where the P-channel type MOSFET is formed. As a result, a source/ drain area 12, which is deeper than the extension area 11, is formed in the silicon substrate 10.

According to the above sequential process, the MOSFET having the gate electrode of the polymetal structure is finished.

According to the above manufacturing method, the side walls of the MOSFET are formed in two stages.

At first, selective oxidation is executed in a state that heating in an atmosphere of hydrogen is suppressed to the minimum level in order to secure reliability of the gate insulating film so that the thin (for example, about 3 nm) silicon oxide film 6 is formed without causing penetration of the boron and gate bird's beak. Then, the first side wall composed of the silicon nitride film 7 is formed on the side surface of the gate electrode by RIE where the silicon substrate 10 is used as the etching stopper. In the RIE, since the thickness of the silicon nitride film 7 is sufficiently thin, damage of the silicon substrate 10 can be suppressed to the minimum level.

Next, thermal oxidation is executed so that the thick (for example, about 6 nm) silicon oxide film 8 is formed. The gate electrode having the polymetal structure is protected by the first side wall (silicon nitride film). Therefore, according to the oxidizing method such as RTO other than selective oxidation, while oxidation of the tungsten film 4 is being prevented, the thick (for example, about 6 nm) silicon oxide film 8 can be formed without causing penetration of the boron and gate bird's beak. Then, the second side wall composed of the silicon nitride film 9 is formed on the side surface of the gate electrode by RIE where the silicon oxide film 8 is used as the etching stopper. In the RIE, since the thickness of the silicon oxide film 8 is sufficiently thick, the digging of the substrate can be prevented.

According to the present invention, the side walls of the MOSFET having the gate electrode of the polymetal structure can be formed without damaging the silicon substrate and without scattering the element property due to the penetration of the boron and gate bird's beak.

Incidentally, in the above manufacturing method, when the sufficiently thick silicon oxide film 8 is formed, RTO was used, other thermal oxidizing methods such as the selective oxidation, which was used when the silicon oxide film 6 was formed, may be used again.

In this case, since the sufficiently thick (about 6 nm) silicon oxide film 8 is formed, the selective oxidation is executed at a 900° C. atmosphere of hydrogen and vapor ($H_2O$).

An advantage of the case that the silicon oxide film 8 is formed by the selective oxidation is that the abnormal oxidation of the tungsten film 4 can be prevented completely. Namely, in the above manufacturing method, the tungsten film 4 is fairly protected by the silicon nitride film 7, but the silicon nitride film 7 is formed so as to be thin (about 10 nm). Therefore, a pin hole is possibly formed in the silicon nitride film 7, and the selective oxidation is very effective as a countermeasure against the pin hole.

As described above, according to the manufacturing method of the present invention, the first side wall composed of the silicon nitride film is formed by RIE where the silicon substrate is used as the etching stopper. In the RIE, since the thin silicon nitride film is etched, damage of the silicon substrate can be suppressed to the minimum level.

Next, the thick silicon oxide film is formed by the thermal oxidation (RTO, selective oxidation or the like), and the second side wall composed of the silicon nitride film is formed by RIE where the thick silicon oxide film is used as the etching stopper. In this thermal oxidation, since the gate electrode of the polymetal structure is protected by the first side wall, abnormal oxidation of the metal, penetration of the boron and gate bird's beak can be prevented. Moreover, in the RIE, since the thick silicon oxide film is used as the etching stopper, digging of the substrate can be prevented.

Since the side walls are formed in the two stages in such a manner, the side walls of the MOSFET having the gate electrode of the polymetal structure can be formed without greatly damaging the silicon substrate and without scattering the element property due to the penetration of the boron and gate bird's beak.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device comprising the steps of:

forming a gate electrode, whose lower layer is composed of polysilicon and upper layer is composed of refractory metal, on a silicon substrate;

forming a first silicon nitride film on the silicon substrate so as to cover the gate electrode;

etching the first silicon nitride film so as to let the first silicon nitride film remain on a side surface of the gate electrode;

forming a first silicon oxide film on the silicon substrate using thermal oxidation;

forming a second silicon nitride film on the silicon substrate so as to cover the gate electrode;

etching the second silicon nitride film by using the first silicon oxide film as an etching stopper, thereby leaving the second silicon nitride film on the side surface of the gate electrode; and before forming the first silicon nitride film, forming a second silicon oxide film on a surface of the silicon substrate and the polysilicon using selective oxidation, wherein the first silicon oxide film is formed so as to be thicker than the second silicon oxide film.

2. The method of claim 1, wherein the refractory metal is tungsten, and tungsten nitride is positioned between the polysilicon and the refractory metal.

3. The method of claim 1, wherein the polysilicon contains boron.

4. The method of claim 1, wherein the selective oxidation is executed in an atmosphere of hydrogen and vapor ($H_2O$).

5. The method of claim 1, wherein the thermal oxidation is selective oxidation executed in an atmosphere of hydrogen and vapor ($H_2O$).

6. The method of claim 1, wherein the first silicon nitride film is etched under a condition that the silicon substrate is used as an etching stopper, and the second silicon nitride film is etched under a condition that the first silicon oxide film is used as an etching stopper.

7. The method of claim 1, further comprising the steps of:

forming a shallow impurity area using ion implantation where the gate electrode is used as a mask; and forming a deep impurity area to be a source/drain using ion implantation where the gate electrode and the first and second silicon nitride films are used as a mask.

8. The method of claim 1, wherein a thickness of the first silicon nitride film is not more than 10 nm (excluding 0).

9. The method of claim 1, wherein the second silicon nitride film is formed so as to be thicker than the first silicon nitride film.

10. A manufacturing method of a semiconductor device comprising the steps of:

forming a gate electrode on a silicon substrate;

forming a non-oxidizable protecting film on the silicon substrate so as to cover the gate electrode;

etching the non-oxidizable protecting film so as to let the non-oxidizable protecting film remain on a side surface of the gate electrode;

forming a first silicon oxide film on the silicon substrate using thermal oxidation;

forming a spacer film on the silicon substrate so as to cover the gate electrode;

etching the spacer film by using the first silicon oxide film as an etching stopper, thereby leaving the spacer film on the side surface of the gate electrodes; and before forming the non-oxidizable protecting film, forming a second silicon oxide film on surfaces of the silicon substrate and the gate electrode using oxidation, wherein the first silicon oxide film is formed so as to be thicker than the second silicon oxide film.

11. The method of claim 10, wherein the gate electrode is composed of one of polysilicon and metal.

12. The method of claim 10, wherein the non-oxidizable protecting film is a silicon nitride film.

13. The method of claim 10, wherein the spacer film is a silicon nitride film.

14. The method of claim 10, wherein the non-oxidizable protecting film is etched under a condition that the silicon substrate is used as an etching stopper, and the spacer film is etched under a condition that the first silicon oxide film is used as an etching stopper.

15. The method of claim 10, further comprising the steps of:

forming a shallow impurity area using ion implantation where the gate electrode is used as a mask; and forming a deep impurity area to be a source/drain using ion implantation where the gate electrode, the non-oxidizable protecting film and the spacer film are used as a mask.

16. The method of claim 10, wherein a thickness of the non-oxidizable protecting film is not more than 10 nm (excluding 0).

17. The method of claim 10, wherein the spacer film is formed so as to be thicker than the non-oxidizable protecting film.

* * * * *